United States Patent
Tucker

(10) Patent No.: US 11,069,160 B2
(45) Date of Patent: Jul. 20, 2021

(54) SYSTEMS AND METHODS OF OPTIMIZING UTILIZATION OF VEHICLE ONBOARD STORAGE

(71) Applicant: Bell Helicopter Textron Inc., Fort Worth, TX (US)

(72) Inventor: Brian Edward Tucker, Fort Worth, TX (US)

(73) Assignee: Bell Helicopter Textron Inc., Fort Worth, TX (US)

( * ) Notice: Subject to any disclaimer, the term of this patent is extended or adjusted under 35 U.S.C. 154(b) by 263 days.

(21) Appl. No.: 16/227,488

(22) Filed: Dec. 20, 2018

(65) Prior Publication Data
US 2020/0202640 A1    Jun. 25, 2020

(51) Int. Cl.
| | | |
|---|---|---|
| G07C 5/08 | (2006.01) |
| H03M 7/30 | (2006.01) |
| G06N 20/00 | (2019.01) |
| H04L 29/08 | (2006.01) |
| H04W 4/48 | (2018.01) |

(52) U.S. Cl.
CPC ............ *G07C 5/085* (2013.01); *G06N 20/00* (2019.01); *H03M 7/3059* (2013.01); *H04L 67/12* (2013.01); *H04W 4/48* (2018.02)

(58) Field of Classification Search
None
See application file for complete search history.

(56) References Cited

U.S. PATENT DOCUMENTS

| | | | |
|---|---|---|---|
| 8,219,280 B2* | 7/2012 | Ishikawa | G07C 5/085 |
| | | | 701/34.4 |
| 9,337,861 B2* | 5/2016 | Bordeleau | H03M 7/3059 |
| 10,210,672 B2* | 2/2019 | James | H04L 67/025 |
| 10,549,862 B1* | 2/2020 | Haines | F02D 41/263 |
| 10,672,204 B2* | 6/2020 | Chopra | G05B 23/0243 |
| 2016/0063776 A1* | 3/2016 | Chronowski | B60Q 9/00 |
| | | | 701/29.1 |

(Continued)

OTHER PUBLICATIONS

Romano et al., "Measuring Dependency Via Intrinsic Dimensionality", 23rd International Conference on Pattern Recognition (ICPR), Dec. 2016, pp. 1207-1212. (Year: 2016).*

*Primary Examiner* — Todd Melton
(74) *Attorney, Agent, or Firm* — Shackelford, Bowen, McKinley & Norton, LLP

(57) ABSTRACT

In an embodiment, a method includes monitoring environmental conditions via a plurality of sensors positioned in proximity to a vehicle. The method also includes receiving, from one or more of the plurality of sensors, a first measured value of a first environmental variable and at least one additional measured value of at least one additional environmental variable. In addition, the method includes automatically determining, via a machine-learning model, a first expected value of the first environmental variable given the at least one additional measured value of the at least one additional environmental variable. Furthermore, the method includes automatically generating a storage decision in relation to the first measured value based, at least in part, on an evaluation of the first measured value relative to the first expected value. Additionally, the method includes causing execution of the storage decision at least with respect to onboard storage of the vehicle.

20 Claims, 6 Drawing Sheets

(56) References Cited

U.S. PATENT DOCUMENTS

2018/0123612 A1* 5/2018 Pyayt .................. H03M 7/6058
2018/0144621 A1* 5/2018 Arai ........................ G07C 5/00
2020/0151967 A1* 5/2020 Boggio ................ G07C 5/0816

* cited by examiner

SYSTEMS AND METHODS OF OPTIMIZING UTILIZATION OF VEHICLE ONBOARD STORAGE

BACKGROUND

Technical Field

The present disclosure relates generally to vehicle monitoring and more particularly, but not by way of limitation, to systems and methods of optimizing vehicle onboard storage.

History of Related Art

Vehicles such as aircraft can produce vast amounts of data regarding vehicle operation. However, onboard storage resources are typically limited. Therefore, it is often the case that not all data which is produced can be retained.

SUMMARY

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

In an embodiment, a method of optimizing utilization of vehicle onboard storage is performed by a computer system for a vehicle. The method includes monitoring real-time environmental conditions via a plurality of sensors positioned in proximity to the vehicle. The method also includes, responsive to the monitoring, receiving, from one or more of the plurality of sensors, a first measured value of a first environmental variable and at least one additional measured value of at least one additional environmental variable. In addition, the method includes automatically determining, via a machine-learning model, a first expected value of the first environmental variable given the at least one additional measured value of the at least one additional environmental variable. Furthermore, the method includes automatically generating a storage decision in relation to the first measured value based, at least in part, on an evaluation of the first measured value relative to the first expected value. Additionally, the method includes causing execution of the storage decision at least with respect to onboard storage of the vehicle.

In an embodiment, a vehicle computer system includes a processor and memory, where the processor and the memory in combination are operable to perform a method. The method includes monitoring real-time environmental conditions via a plurality of sensors positioned in proximity to the vehicle. The method also includes, responsive to the monitoring, receiving, from one or more of the plurality of sensors, a first measured value of a first environmental variable and at least one additional measured value of at least one additional environmental variable. In addition, the method includes automatically determining, via a machine-learning model, a first expected value of the first environmental variable given the at least one additional measured value of the at least one additional environmental variable. Furthermore, the method includes automatically generating a storage decision in relation to the first measured value based, at least in part, on an evaluation of the first measured value relative to the first expected value. Additionally, the method includes causing execution of the storage decision at least with respect to onboard storage of the vehicle.

In one embodiment, a computer-program product includes a non-transitory computer-usable medium having computer-readable program code embodied therein, the computer-readable program code adapted to be executed to implement a method. The method includes monitoring real-time environmental conditions via a plurality of sensors positioned in proximity to the vehicle. The method also includes, responsive to the monitoring, receiving, from one or more of the plurality of sensors, a first measured value of a first environmental variable and at least one additional measured value of at least one additional environmental variable. In addition, the method includes automatically determining, via a machine-learning model, a first expected value of the first environmental variable given the at least one additional measured value of the at least one additional environmental variable. Furthermore, the method includes automatically generating a storage decision in relation to the first measured value based, at least in part, on an evaluation of the first measured value relative to the first expected value. Additionally, the method includes causing execution of the storage decision at least with respect to onboard storage of the vehicle.

BRIEF DESCRIPTION OF THE DRAWINGS

A more complete understanding of the method and apparatus of the present disclosure may be obtained by reference to the following Detailed Description when taken in conjunction with the accompanying Drawings wherein.

DETAILED DESCRIPTION

Figure 1:
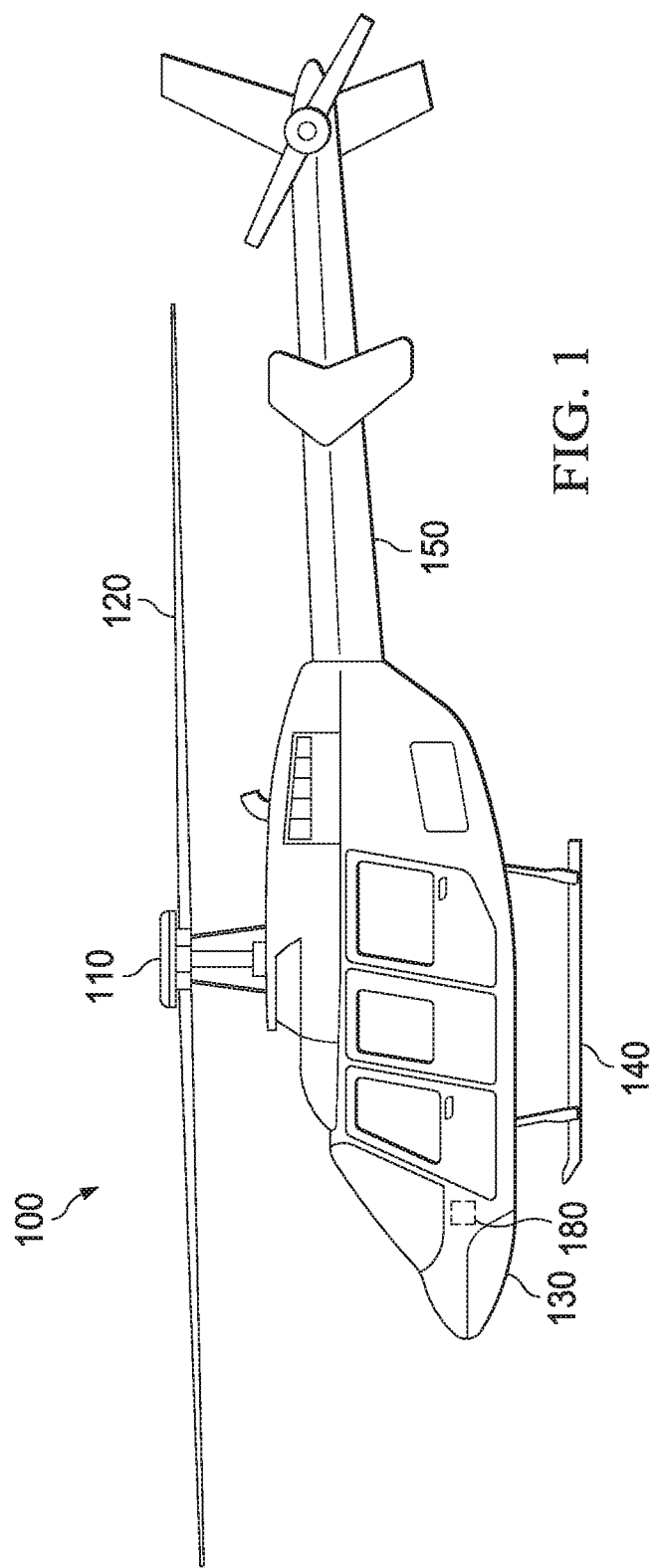
FIG. 1 illustrates an aircraft.

While the making and using of various embodiments of the present disclosure are discussed in detail below, it should be appreciated that the present disclosure provides many applicable inventive concepts, which can be embodied in a wide variety of specific contexts. The specific embodiments discussed herein are merely illustrative and do not delimit the scope of the present disclosure. In the interest of clarity, not all features of an actual implementation may be described in the present disclosure. It will of course be appreciated that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming but would be a routine undertaking for those of ordinary skill in the art having the benefit of this disclosure.

In the specification, reference may be made to the spatial relationships between various components and to the spatial orientation of various aspects of components as the devices are depicted in the attached drawings. However, as will be recognized by those skilled in the art after a complete reading of the present disclosure, the devices, members, apparatuses, and the like described herein may be positioned in any desired orientation. Thus, the use of terms such as "above," "below," "upper," "lower" or other like terms to describe a spatial relationship between various components or to describe the spatial orientation of aspects of such components should be understood to describe a relative relationship between the components or a spatial orientation of aspects of such components, respectively, as the device described herein may be oriented in any desired direction. In addition, as used herein, the term "coupled" may include direct or indirect coupling by any means, including moving and/or non-moving mechanical connections.

Vehicles often store large amounts of data regarding vehicle operation. Aircraft, for example, can include sensors of various types such as pressure sensors, temperature sensors, force sensors, torque sensors, speed sensors, position and displacement sensors, level sensors, proximity sensors, flow sensors, accelerometers, gyroscopes, pitot probes, radar sensors, Angle-of-Attack (AoA) sensors, altimeter sensors, smoke-detection sensors, global positioning system (GPS) sensors and/or other types of sensors. Additional examples of sensors include cloud-height sensors, visibility sensors, wind sensors, dew-point sensors, relative humidity sensors, lightning or thunder-storm sensors, precipitation-type sensors, precipitation-occurrence sensors, freezing-rain sensors, precipitation-accumulation sensors, snow-depth sensors, day/night sensors, combinations of the foregoing and/or the like. Continuing the aircraft example, aircraft can also include sensors related to operation of particular system functions such as engines, doors and slides, cabin and cargo environmental controls, flight decks and flight controls, landing gears, wheels and brakes, fuel, hydraulic and pneumatic systems, and wired and wireless network-connectivity systems. Sensors such as the foregoing example sensors often produce new measurements on a regular or continuous basis. Storing, and retaining, the most important data is technically challenging, particularly in mobile environments, such as vehicles, where data is regularly overwritten due to storage limitations.

Further to the above problems, the ability to move data off a vehicle, such as aircraft, is often not feasible or highly limited, for example, due to network availability, transmission bandwidth or cost. Continuing the aircraft example, a high-bandwidth wired or wireless network connection, for example, may be available to an aircraft while on the ground, and other networks, such as satellite and cellular networks, may periodically be visible or available while in flight and/or on the ground.

One way to approach the above problem might be to store, persist, or otherwise ensure retention of operational data from certain sensors when a pre-defined event occurs, such as when a sensor provides a value that exceed a pre-established threshold. Problematically, however, this storage scheme relies upon preconceived notions of peaks, when what constitutes a peak may not be the same across operational conditions. Noteworthy engine temperatures, for example, can vary considerably based on air temperature. Thresholding is therefore technically difficult due to the potential overinclusion and underinclusion of data, the dynamic nature of what constitutes relevant or noteworthy data, and the fact that data not retained is generally lost.

The present disclosure describes examples of optimizing vehicle onboard storage using machine learning (ML) techniques. In general, ML as discussed herein can encompass various types of algorithms such as, for example, decision tree learning, association rule learning, artificial neural networks (including deep learning), inductive logic programming, support vector machines, clustering, Bayesian networks, reinforcement learning, representation learning, similarity and metric learning, sparse dictionary learning, genetic algorithms, rule-based ML, gradient boosting, ML based on generalized linear modeling, random forest, ensemble learning, combinations of the foregoing and/or the like.

In certain embodiments, a vehicle control system can monitor sensors that produce measured values of a plurality of environmental variables. In general, the environmental variables can each relate to any type of operational data operable to be provided by a sensor such as, for example, any of the example sensors described previously. In various embodiments, the vehicle control system can leverage a ML model to individually ascertain, for each environmental variable, an expected value of that environmental variable in light of the measured values of one or more other environmental variables that are potentially provided via other sensors. In that way, storage decisions and other decisions can be made based on how a new measured value compares to the expected value given other operational conditions. Advantageously, in certain embodiments, storage decisions can be made more intelligently and dynamically and data that is more important or significant can be retained.

For purposes of this patent application, the term "vehicle" includes, but is not limited to, land, water and air-based vessels or vehicles including, but not limited to, water vessels, aircraft, and land-based vehicles such as automobiles and trains. For purposes of illustration, examples will be periodically described herein relative to aircraft. It should be appreciated, however, that the principles described herein are not limited to aircraft and can similarly be applied to any other type of vehicle.

FIG. 1 illustrates an aircraft 100 according to one example embodiment. For illustrative purposes, the aircraft 100 is shown to be a rotorcraft. Aircraft 100 features a rotor system 110, blades 120, a fuselage 130, a landing gear 140, and an empennage 150. Rotor system 110 may rotate blades 120. Rotor system 110 may include a control system for selectively controlling the pitch of each blade 120 in order to selectively control direction, thrust, and lift of aircraft 100. Fuselage 130 represents the body of aircraft 100 and may be coupled to rotor system 110 such that rotor system 110 and blades 120 may move fuselage 130 through the air. Landing gear 140 supports aircraft 100 when aircraft 100 is landing and/or when aircraft 100 is at rest on the ground. Empennage 150 represents the tail section of the aircraft. Teachings of certain embodiments relating to rotor systems described herein may apply to rotor system 110 and/or other rotor systems, such as other tilt rotor and helicopter rotor systems. It should also be appreciated that teachings from aircraft 100 may apply to aircraft other than rotorcraft, such as airplanes and unmanned aircraft, to name a few examples. Similarly, as mentioned previously, the teachings from aircraft 100 can also be applied to other types of vehicles.

A vehicle control system 180, which can be, or include, a flight control computer, is schematically shown in fuselage 130, but it should be appreciated that the vehicle control system 180 may take a number of forms and exist in a variety of locations within aircraft 100. Similarly, although vehicle control system 180 is illustrated singly, vehicle control system 180 can be illustrative of two, three, four or any other suitable number of computers in aircraft 100, which computers can be located in same, similar or different locations within fuselage 130 or elsewhere in aircraft 100. In some cases, the vehicle control system 180 can be, or include, a health and usage monitoring system (HUMS).

The vehicle control system 180 can function as a vehicle monitoring system and, in a typical embodiment, is configured to control and communicate with various systems within aircraft 100 including, for example, various sensors of the type described above. A pilot may manipulate pilot flight controls in order to achieve controlled aerodynamic flight. Inputs provided by the pilot to the pilot flight controls may be transmitted electronically to the vehicle control system 180. The vehicle control system 180 can include, represent or be communicably coupled to devices operable to change the flight characteristics of the aircraft such as, for example, the positions of blades 120 of FIG. 1.

Figure 2:
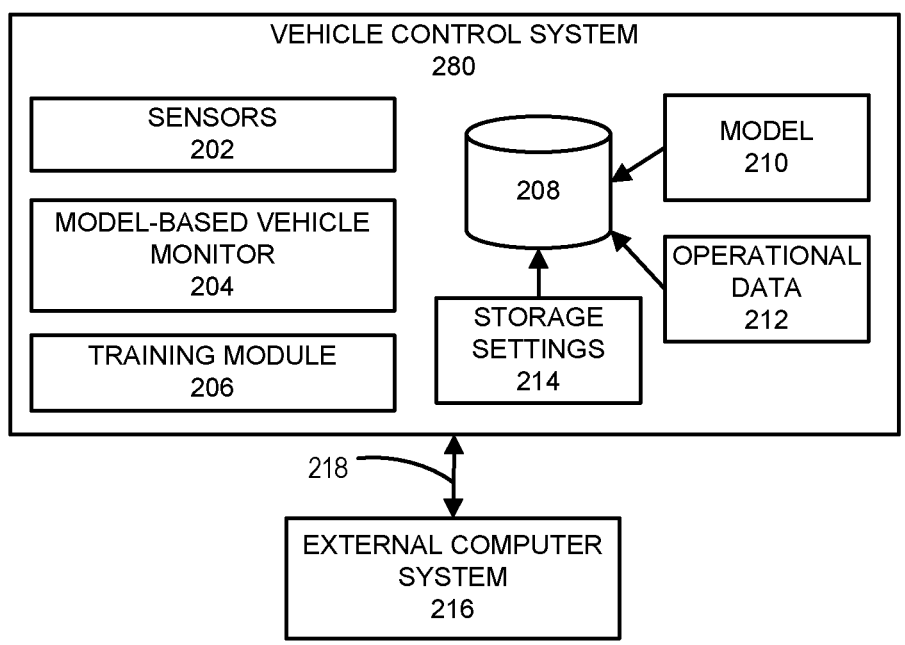
FIG. 2 illustrates an example communication environment that includes a vehicle control system.

FIG. 2 illustrates an example communication environment 200 that includes a vehicle control system 280 and an external computer system 216. The vehicle control system 280 can be a control system for a vehicle such as, for example, the aircraft 100 of FIG. 1, or another type of vehicle. For example, the vehicle control system 280 can be similar to the vehicle control system 180 of FIG. 1. In some embodiments, the vehicle control system 280 can be, or include, a HUMS. In the illustrated embodiment, the vehicle control system 280 includes sensors 202, a model-based vehicle monitor 204, a training module 206 and one or more data stores 208.

The external computer system 216 can be any computer system operable to communicate over a network. In some embodiments, the external computer system 216 can be a central computer system that communicates with a plurality of computer systems similar to the vehicle control system 280. In certain embodiments, the vehicle control system 280 and the external computer system 216 can be communicably coupled via a communication link 218. The communication link 218 can represent wired or wireless communication, inclusive of intervening networks such as, for example, the Internet or a portion thereof.

The sensors 202 can include any sensor operable to provide data related to real-time environmental conditions of the vehicle and can be varied to suit a type of the vehicle. In general, some or all of the sensors 202 are positioned in proximity to the vehicle and are operable to provide data relevant to operation of the vehicle. Each type of data operable to be provided by a given sensor of the sensors 202 may be referred to herein as an environmental variable, with the sensors 202 collectively being operable to periodically or continually produce measured values of a set of environmental variables. For example, in various cases, the sensors 202 can include pressure sensors, temperature sensors, force sensors, torque sensors, speed sensors, position and displacement sensors, level sensors, proximity sensors, flow sensors, accelerometers, gyroscopes, pitot probes, radar sensors, AoA sensors, altimeter sensors, smoke-detection sensors, GPS sensors, and/or other types of sensors. The sensors 202 can also include, for example, cloud-height sensors, visibility sensors, wind sensors, dew-point sensors, relative humidity sensors, lightning or thunder-storm sensors, precipitation-type sensors, precipitation-occurrence sensors, freezing-rain sensors, precipitation-accumulation sensors, snow-depth sensors, day/night sensors, combinations of the foregoing and/or the like. In various cases, depending on vehicle type, the sensors 202 can include sensors related to operation of particular system functions such as engines, doors and slides, cabin and cargo environmental controls, flight decks and flight controls, landing gears, wheels and brakes, fuel, hydraulic and pneumatic systems, wired and wireless network connectivity systems, combinations of the foregoing and/or the like. In addition, or alternatively, at least some of the sensors 202 can indirectly detect the real-time environmental conditions by pulling, for example, weather-related information or other information from external data sources over the communication link 218.

In a typical embodiment, the data store(s) 208 collectively represent onboard storage of the vehicle, and can include volatile memory, nonvolatile memory and/or virtualizations thereof. Additionally, or alternatively, the data store(s) 208 can encompass data structures used to organize and store all or a portion of the data contained therein. In general, the data store(s) 208 can store any data used by or accessible to the vehicle control system 280. For example, in the illustrated embodiment, the data store(s) 208 can store a ML model 210, operational data 212 and storage settings 214.

The operational data 212 can include at least some of the measured values produced by the sensors 202. The operational data 212 can be implemented as, or stored in, a fixed-size buffer that overwrites data as necessary, in a configurable fashion, to accommodate storage of new data. For example, in certain embodiments, each measured value of each environmental variable can be associated with a priority value that indicates the value's relative importance. In certain embodiments, the operational data 212 enables a progression of priority values or categories, ranging from lowest priority to highest priority, where data is overwritten in an order that is at least partially based on an associated priority value or category. For example, data or values associated with relatively lower priority values can be overwritten before data or values that are associated with relatively higher priority values. In some instances, the progression of priority values or categories can include two priority values or categories, such that particular measured values are, in effect, either prioritized or not prioritized.

In certain embodiments, the ML model 210 can be trained with training data containing example values of some or all of the set of environmental variables for which the sensors 202 are operable to produce measured values. In more detail, the ML model 210 is usable to determine, for each environmental variable for which it has been trained, a predicted or expected value of that environmental variable given measured values of one or more others of the environmental variables. In an example, the ML model 210 could be trained so as to be used to determine a predicted or expected value of environmental variable V1 given measured values of two other environmental variables V2 and V3. Continuing this example, the ML model 210 could also be trained so as to be used to determine a predicted or expected value of the environmental variable V2 given measured values of the environmental variables V1 and V3.

In certain embodiments, the storage settings 214 can include criteria usable to generate real-time storage decisions. The storage settings 214 can establish, for example, the above-described progression of priority values or categories, where different criteria is associated in the storage settings 214 with different priority values or categories. The criteria can be specified in terms of values that are indicative of how measured values compare to corresponding predicted or expected values.

For example, the storage settings 214 can include one or more thresholds that are expressed in terms of an absolute difference between a measured value and an expected value, as a ratio of such an absolute difference to the measured value and/or the expected value, and/or in other suitable ways. In some embodiments, the storage settings 214 can include a plurality of thresholds, where each threshold is associated with a distinct priority value or category in the progression of priority values or categories. For a particular measured value of a given environmental variable, the applicable priority value or category can be, for example, the highest priority value or category for which the corresponding threshold is satisfied. In some embodiments, the same threshold or plurality of thresholds can be applicable to all environmental variables. In other embodiments, each environmental variable, or a subset of environmental variables, can be associated in the storage settings 214 with its own threshold or plurality of thresholds.

The model-based vehicle monitor 204 can monitor real-time environmental conditions of the vehicle using the sensors 202, the ML model 210 and the storage settings 214. More particularly, the model-based vehicle monitor 204 can periodically or continuously receive, from the sensors 202, the measured values of the set of environmental variables. For one, some or all of the measured values, the model-based vehicle monitor 204 can use the ML model 210 to automatically determine a predicted or expected value of the corresponding environmental variable, given a current or most recent measured value of one or more other environmental variables.

In certain embodiments, for each measured value for which a predicted or expected value is automatically determined, the model-based vehicle monitor 204 can use the storage settings 214 to automatically generate a storage decision in relation to the measured value. The storage decision can indicate, for example, storage of the measured value as part of the operational data 212, non-storage of the measured value, transmission of the measured value, for example, to the external computer system 216 for off-board storage, and/or other storage options. Additionally, the storage decision can indicate a priority value or category for the measured value. The model-based vehicle monitor 204 can cause execution of the storage decision, for example, by storing, not storing and/or transmitting the measured value according to the storage decision. In various cases, if the storage decision involves storage of the measured value as part of the operational data 212, the model-based vehicle monitor 204 can store the measured value in the data store(s) 208, as part of the operational data 212, in relation to the indicated priority value or category. Example functionality of the model-based vehicle monitor 204 will be described in greater detail with respect to FIGS. 3-4.

In some embodiments, the ML model 210 can be pre-trained and received from another component such as, for example, the external computer system 216. In addition, or alternatively, the ML model 210 can be generated and trained by the training module 206. The training module 206 is operable to create, or train, a ML model using training data. In certain embodiments, the training data can include example values of all or a portion of the set of environmental variables for which the sensors 202 are operable to produce measured values. In some embodiments, the training module 206 can automatically re-train the ML model 210, or generate a new model to replace the ML model 210, using stored values in the operational data 212. Training by the training module 206 can also involve establishing all or part of the storage settings 214. Although not explicitly illustrated as such, the training module 206 can similarly reside on the external computer system 216. Example functionality that can be performed by the training module 206 will be described in greater detail with respect to FIG. 5.

Figure 3:
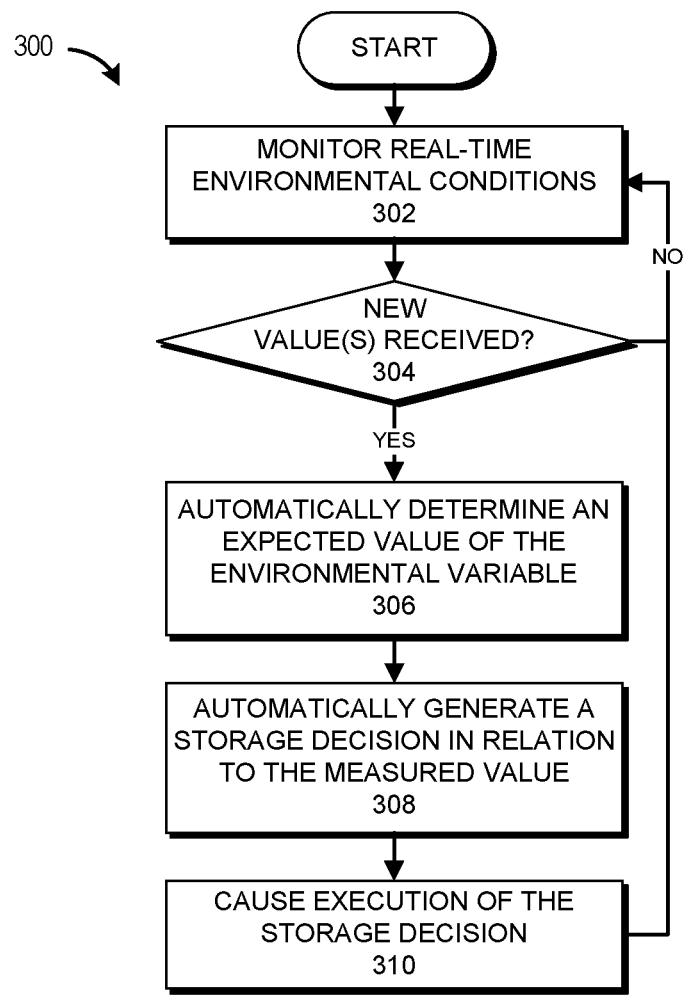
FIG. 3 illustrates an example of a process for monitoring a vehicle using a machine-learning model.

FIG. 3 illustrates an example of a process 300 for monitoring a vehicle using a ML model. Although the process 300 can be executed by any number of different components, to simplify discussion, the process 300 will be described relative to specific components of the example communication environment 200 of FIG. 2 and with particular reference to the model-based vehicle monitor 204.

At block 302, the model-based vehicle monitor 204 monitors real-time environmental conditions of the vehicle via the sensors 202. In general, the monitoring can include the model-based vehicle monitor 204 checking or waiting for new measured values of the set of environmental variables from the sensors 202.

At decision block 304, the model-based vehicle monitor 204 determines whether a new measured value of an environmental variable has been received. If it is determined at the decision block 304 that no new measured value of an environmental variable has been received, the process 300 returns to the block 302 and the model-based vehicle monitor 204 continues to monitor real-time environmental conditions of the vehicle as described previously. Otherwise, if it is determined at the decision block 304 that a new measured value of an environmental variable has been received, the process 300 can iterate through blocks 306-310 in parallel for each new measured value that is received. For simplicity of description, blocks 306-310 will be described relative to a single new measured value.

At block 306, the model-based vehicle monitor 204 automatically determines, via the ML model 210, a predicted or expected value of the environmental variable for which the new measured value was received, given one or more measured values of one or more other environmental variables. In general, the predicted or expected value is automatically determined using current or most recent measured values for the one or more other environmental variables. For example, if the new measured value relates to engine temperature, a predicted or expected value of the engine temperature can be automatically determined given current or most recent measured values, for example, of air temperature, engine speed and engine torque. In another example, if the new measured value relates to engine speed, a predicted or expected value of the engine speed can be automatically determined given current or most recent values, for example, of engine temperature, air temperature and engine torque.

At block 308, the model-based vehicle monitor 204 automatically generates a storage decision in relation to the new measured value based, at least in part, on an evaluation of the new measured value relative to the predicted or expected value from the block 306. In general, the storage decision can indicate, for example, storage of the measured value as part of the operational data 212, non-storage of the measured value, transmission of the measured value over the communication link 218, for example, to the external computer system 216 for off-board storage, and/or other storage options. Furthermore, the storage decision can indicate storage or transmission of one or more additional measured values such as, for example, measured values of any other environmental variables in the set of environmental variables. The storage decision can indicate a priority value or category for the measured value and any additional measured values that are stored or transmitted.

At block 310, the model-based vehicle monitor 204 causes execution of the storage decision, for example, by storing, not storing and/or transmitting the measured value according to the storage decision from the block 308. In various cases, if the storage decision involves storage of the measured value as part of the operational data 212, the model-based vehicle monitor 204 can store the measured value in the data store(s) 208, as part of the operational data 212, in relation to the indicated priority value or category.

Storage in the data store(s) 208 can involve, for example, overwriting lower-priority data as described previously. In addition, or alternatively, the model-based vehicle monitor 204 can further transmit an alert to the external computer system 216, or another component, over the communication link 218. In some cases, the transmission of such an alert can be a result of the measured value having a particular priority value or category.

From block 310, the process 300 returns to the block 302 and the model-based vehicle monitor 204 monitors real-time environmental conditions of the vehicle as described previously. In various embodiments, the process 300 can continue indefinitely until, for example, a conclusion of a mission or trip, shutdown of the vehicle, termination by an administrator or user, or whenever other suitable stop criteria is satisfied.

For illustrative purposes, the process 300 of FIG. 3 describes the generation of real-time storage decisions as a result of real-time monitoring. In some embodiments, however, storage decisions can be made periodically or on a non-real-time basis as a post-processing step (e.g., at the conclusion of a trip or mission). In such cases, the blocks 306-310 could be executed, for example, periodically or at a certain points in time relative to a set of measured values that have accumulated. Other variations will be apparent to one skilled in the art after reviewing the present disclosure.

Figure 4:
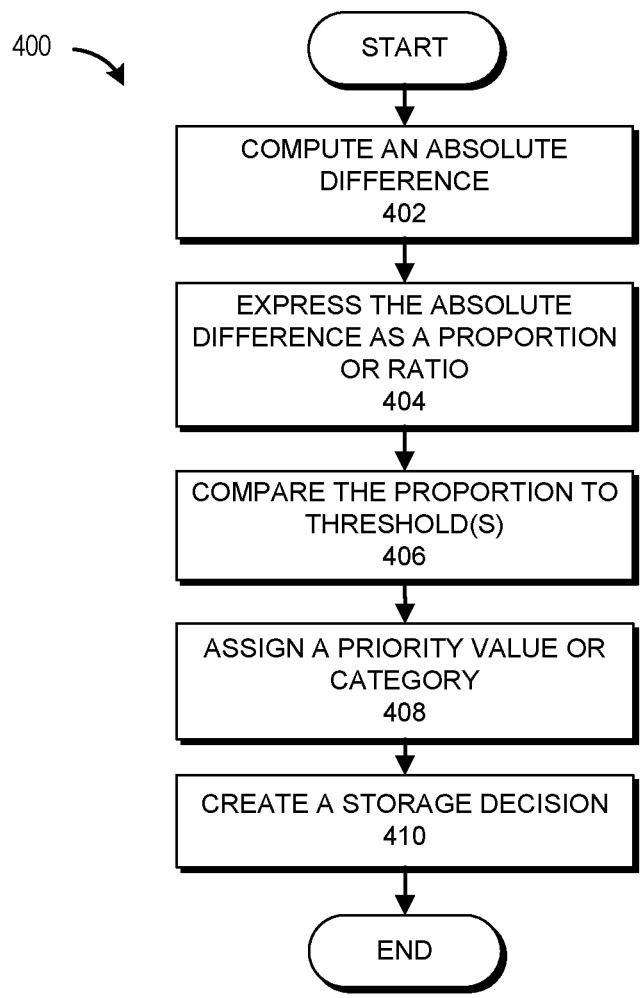
FIG. 4 illustrates an example of a process for automatically generating a storage decision.

FIG. 4 illustrates an example of a process 400 for automatically generating a storage decision. Although the process 400 can be executed by any number of different components, to simplify discussion, the process 400 will be described relative to specific components of the example communication environment 200 of FIG. 2 and with particular reference to the model-based vehicle monitor 204. In a typical embodiment, the process 400 can be performed by the model-based vehicle monitor 204 as all or a portion of the block 308 of the process 300 of FIG. 3.

At block 402, the model-based vehicle monitor 204 computes an absolute difference between a new measured value and a predicted or expected value. In certain embodiments, the new measured value can be a value that is received, for example, as described with respect to the blocks 302-304 of the process 300 of FIG. 3. In similar fashion, the predicted or expected value can be a value that is automatically determined using the ML model 210 as described, for example, with respect to the block 306 of the process 300 of FIG. 3. In that way, the absolute difference can represent an absolute value of a result of subtracting the predicted or expected value from the new measured value.

At block 404, the model-based vehicle monitor 204 expresses the absolute difference as a proportion or ratio of the new measured value, for example, by dividing the absolute difference by the new measured value. In some embodiments, the proportion or ratio can be a result of the aforementioned division. In other embodiments, the proportion or ratio can represent a conversion of that result to a percentage.

At block 406, the model-based vehicle monitor 204 compares the proportion or ratio from the block 404 to each applicable threshold in the storage settings 214. As described previously, in various embodiments, the storage settings 214 can establish a singular threshold or multiple thresholds for individual or multiple environmental variables. In general, the block 406 can include the model-based vehicle monitor 204 determining, for each applicable threshold, whether the proportion or ratio from the block 404 satisfies the threshold.

At block 408, the model-based vehicle monitor 204 assigns a priority value or category to the new measured value based, at least in part, on a result of the block 406. For example, to the extent that there are multiple applicable thresholds, the highest priority value or category for which the corresponding threshold is satisfied can be the assigned priority value or category.

At block 410, the model-based vehicle monitor 204 creates a storage decision. In a typical embodiment, the storage decision is associated with the assigned priority value from the block 408. The storage decision can indicate, for example, storage of the measured value as part of the operational data 212, non-storage of the measured value, transmission of the measured value, for example, to the external computer system 216 for off-board storage, and/or other storage options. The storage decision can be, for example, specified in the storage settings 214, arrived at through programming or logic for the model-based vehicle monitor 204, and/or determined in another suitable fashion.

In some cases, some aspects of the storage decision can be based at least partly on storage availability and/or network availability. In an example, if there is unused onboard storage in the data store(s) 208, the model-based vehicle monitor 204 can determine, as part of the storage decision, to store the measured value as part of the operational data 212 regardless of the assigned priority value, or implement a relaxed standard for doing so. In another example, the model-based vehicle monitor 204 can determine to transmit the measured value for off-board storage based on the assigned priority value in combination with dynamic transmission factors such as available transmission bandwidth, network availability (inclusive of network type such as cellular or satellite), vehicle location or status (e.g., in flight or on the ground) and/or cost. If the assigned priority value exceeds a particular threshold, for example, a determination might be made to transmit the measured value despite limited transmission bandwidth, expense or a non-preferred network type. Conversely, if the assigned value does not exceed that particular threshold, the storage decision may include a non-transmission indication or an indication to delay transmission until certain criteria related to dynamic transmission factors are satisfied. In general, an indication whether to transmit the measured value can be independently varied based on priority value and/or dynamic transmission factors of the type described previously. After block 410, the process 400 ends.

Figure 5:
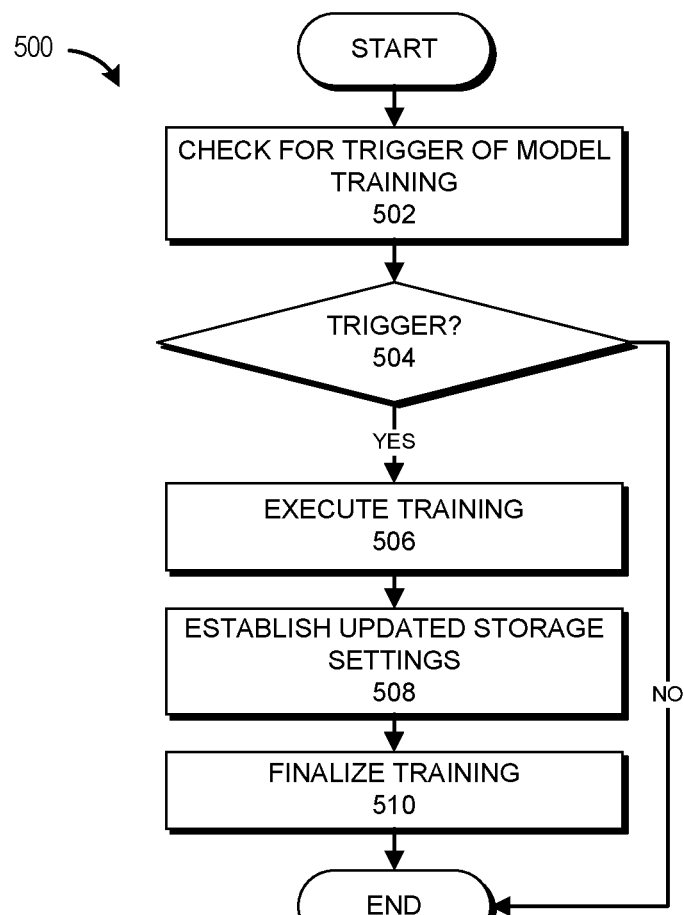
FIG. 5 illustrates an example of a process for training a machine-learning model.

FIG. 5 illustrates an example of a process 500 for training a ML model. Although the process 500 can be executed by any number of different components, to simplify discussion, the process 500 will be described relative to specific components of the example communication environment 200 of FIG. 2 and with particular reference to the training module 206.

At block 502, the training module 206 checks for a trigger of model training. In various embodiments, the trigger can be either manual or automatic. For example, an administrator or user can choose to initiate training, for example, because training has not previously occurred or because improvement in prediction accuracy is desired. By way of further example, training, or a check to determine whether training should occur, can be triggered at the end of a mission, trip or flight. Training, or a check to determine whether training should occur, can also be automatically triggered on a scheduled or periodic basis.

In a particular example of an automatic trigger, the training module 206, or another component, can compare historical predicted or expected values to historical measured values and, responsive to training criteria being satisfied, trigger model training. The training criteria can specify one or more thresholds that, if satisfied, automatically trigger model training. Examples of such thresholds include a threshold absolute difference between historical measured values and historical predicted or expected values and/or a threshold expressed in terms of a proportion of such an absolute difference to either the historical measured values or the historical predicted or expected values. Such thresholds can further include, for example, a threshold sample size over which the absolute difference is manifested. In some embodiments, the thresholds and corresponding evaluations by the training module 206 can relate to an aggregate, or overall, difference across the set of environmental variables for which the sensors 202 are operable to produce measured values. In some cases, the aggregate can be, for example, a mean, median or modal value. In addition, or alternatively, the thresholds and corresponding evaluations by the training module 206 can, at least in some cases, relate to individual environmental variables.

At decision block 504, the training module 206 determines whether training has been triggered. If not, the process 500 ends. Otherwise, if the training module 206 determines that training has been triggered, the process 500 proceeds to block 506. In some embodiments, particularly when training is manually triggered, the blocks 502-504 can be omitted. In these embodiments, the process 500 can instead begin at block 506.

At block 506, the training module 206 executes training using a training dataset according to a desired ML algorithm. The training dataset can, in some cases, include data that is provided by another component such as the external computer system 216. In other cases, particularly in retraining scenarios, the training dataset can include stored measured values in the data store(s) 208. In general, the block 506 yields a ML model that, in various cases, can be, for example, a newly generated model that will serve as the ML model 210. In addition, in some embodiments, the block 506 can yield a confidence limit for each environmental variable on which the yielded ML model is trained.

At block 508, the training module 206 can establish updated storage settings for the storage settings 214. For example, the training module 206 can automatically compute new thresholds of the type described above relative to FIGS. 2-4. In an example, in embodiments in which the thresholds are expressed in terms of a proportion of measured values, the new thresholds can similarly be a proportion, such as 0.05 or an equivalent percentage, plus a confidence limit optionally determined during the training at the block 506. In addition, or alternatively, the updated storage settings can be set or refined via input from users or administrators.

At block 510, the training module 206 finalizes the training. In general, the block 510 can involve the training module 206 replacing the ML model 210 with the ML model yielded by the block 506. In addition, the block 510 can include storing the updated storage settings from the block 508 in the data store(s) 208 as all or part of the storage settings 214. After block 510, the process 500 ends.

Figure 6:
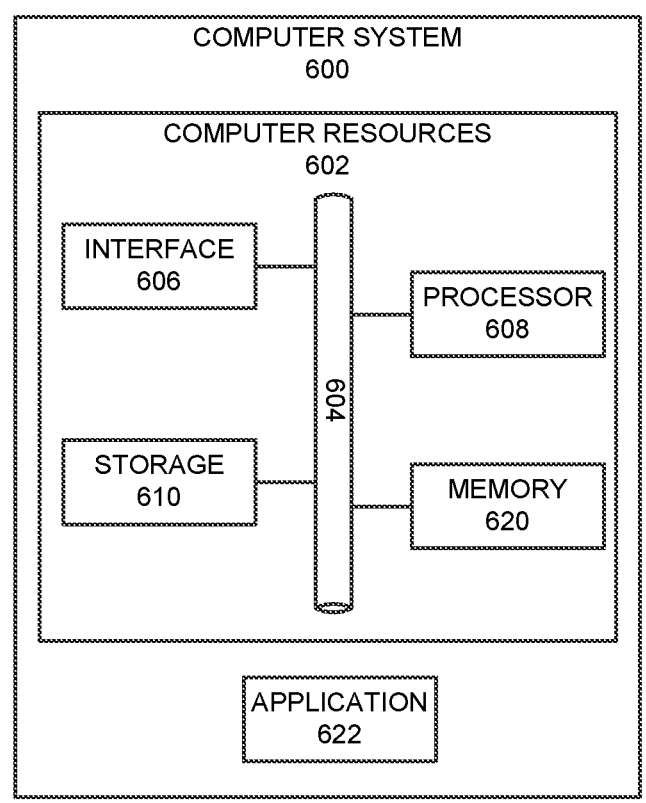
FIG. 6 illustrates an example of a computer system.

FIG. 6 illustrates an example of a computer system 600. In some cases, the computer system 600 can be representative, for example, of computer such as, for example, the vehicle control system 180 of FIG. 1, the vehicle control system 280 of FIG. 2 and/or the external computer system 216 of FIG. 2. The computer system 600 includes an application 622 operable to execute on computer resources 602. The application 622 can include, for example, logic for executing functionality of the model-based vehicle monitor 204 of FIG. 2 and/or the training module 206 of FIG. 2. In particular embodiments, the computer system 600 may perform one or more actions described or illustrated herein. In particular embodiments, one or more computer systems may provide functionality described or illustrated herein. In particular embodiments, encoded software running on one or more computer systems may perform one or more actions described or illustrated herein or provide functionality described or illustrated herein.

The components of the computer system 600 may include any suitable physical form, configuration, number, type and/or layout. As an example, and not by way of limitation, the computer system 600 may include an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a wearable or body-borne computer, a server, or a combination of two or more of these. Where appropriate, the computer system 600 may include one or more computer systems; be unitary or distributed; span multiple locations; span multiple machines; or reside in a cloud, which may include one or more cloud components in one or more networks.

In the depicted embodiment, the computer system 600 includes a processor 608, memory 620, storage 610, interface 606, and bus 604. Although a particular computer system is depicted having a particular number of particular components in a particular arrangement, this disclosure contemplates any suitable computer system having any suitable number of any suitable components in any suitable arrangement.

Processor 608 may be a microprocessor, controller, or any other suitable computing device, resource, or combination of hardware, software and/or encoded logic operable to execute, either alone or in conjunction with other components, (e.g., memory 620), the application 622. Such functionality may include providing various features discussed herein. In particular embodiments, processor 608 may include hardware for executing instructions, such as those making up the application 622. As an example, and not by way of limitation, to execute instructions, processor 608 may retrieve (or fetch) instructions from an internal register, an internal cache, memory 620, or storage 610; decode and execute them; and then write one or more results to an internal register, an internal cache, memory 620, or storage 610.

In particular embodiments, processor 608 may include one or more internal caches for data, instructions, or addresses. This disclosure contemplates processor 608 including any suitable number of any suitable internal caches, where appropriate. As an example, and not by way of limitation, processor 608 may include one or more instruction caches, one or more data caches, and one or more translation lookaside buffers (TLBs). Instructions in the instruction caches may be copies of instructions in memory 620 or storage 610 and the instruction caches may speed up retrieval of those instructions by processor 608. Data in the data caches may be copies of data in memory 620 or storage 610 for instructions executing at processor 608 to operate on; the results of previous instructions executed at processor 608 for access by subsequent instructions executing at processor 608, or for writing to memory 620, or storage 610; or other suitable data. The data caches may speed up read or write operations by processor 608. The TLBs may speed up virtual-address translations for processor 608. In particular embodiments, processor 608 may include one or more internal registers for data, instructions, or addresses. Depending on the embodiment, processor 608 may include any suitable number of any suitable internal registers, where appropriate. Where appropriate, processor 608 may include one or more arithmetic logic units (ALUs); be a multi-core processor; include one or more processors 608; or any other suitable processor.

Memory 620 may be any form of volatile or non-volatile memory including, without limitation, magnetic media, optical media, random access memory (RAM), read-only memory (ROM), flash memory, removable media, or any other suitable local or remote memory component or components. In particular embodiments, memory 620 may include random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM, or any other suitable type of RAM or memory. Memory 620 may include one or more memories 220, where appropriate. Memory 620 may store any suitable data or information utilized by the computer system 600, including software embedded in a computer readable medium, and/or encoded logic incorporated in hardware or otherwise stored (e.g., firmware). In particular embodiments, memory 620 may include main memory for storing instructions for processor 608 to execute or data for processor 608 to operate on. In particular embodiments, one or more memory management units (MMUs) may reside between processor 608 and memory 620 and facilitate accesses to memory 620 requested by processor 608.

As an example, and not by way of limitation, the computer system 600 may load instructions from storage 610 or another source (such as, for example, another computer system) to memory 620. Processor 608 may then load the instructions from memory 620 to an internal register or internal cache. To execute the instructions, processor 608 may retrieve the instructions from the internal register or internal cache and decode them. During or after execution of the instructions, processor 608 may write one or more results (which may be intermediate or final results) to the internal register or internal cache. Processor 608 may then write one or more of those results to memory 620. In particular embodiments, processor 608 may execute only instructions in one or more internal registers or internal caches or in memory 620 (as opposed to storage 610 or elsewhere) and may operate only on data in one or more internal registers or internal caches or in memory 620 (as opposed to storage 610 or elsewhere).

In particular embodiments, storage 610 may include mass storage for data or instructions. For example, in various embodiments, storage 610 can store all or a portion of the contents of the data store(s) 208 of FIG. 2. As an example, and not by way of limitation, storage 610 may include a hard disk drive (HDD), a floppy disk drive, flash memory, an optical disc, a magneto-optical disc, magnetic tape, or a Universal Serial Bus (USB) drive or a combination of two or more of these. Storage 610 may include removable or non-removable (or fixed) media, where appropriate. Storage 610 may be internal or external to the computer system 600, where appropriate. In particular embodiments, storage 610 may be non-volatile, solid-state memory. In particular embodiments, storage 610 may include read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. Storage 610 may take any suitable physical form and may include any suitable number or type of storage. Storage 610 may include one or more storage control units facilitating communication between processor 608 and storage 610, where appropriate.

In particular embodiments, interface 606 may include hardware, encoded software, or both providing one or more interfaces for communication (such as, for example, packet-based communication) among any networks, any network devices, and/or any other computer systems. As an example, and not by way of limitation, communication interface 606 may include a network interface controller (NIC) or network adapter for communicating with an Ethernet or other wire-based network and/or a wireless NIC (WNIC) or wireless adapter for communicating with a wireless network.

Depending on the embodiment, interface 606 may be any type of interface suitable for any type of network for which computer system 600 is used. As an example, and not by way of limitation, computer system 600 can include (or communicate with) an ad-hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 600 can include (or communicate with) a wireless PAN (WPAN) (such as, for example, a BLU-ETOOTH WPAN), a WI-FI network, a WI-MAX network, an LTE network, an LTE-A network, a cellular telephone network (such as, for example, a Global System for Mobile Communications (GSM) network), or any other suitable wireless network or a combination of two or more of these. The computer system 600 may include any suitable interface 606 for any one or more of these networks, where appropriate.

In some embodiments, interface 606 may include one or more interfaces for one or more I/O devices. One or more of these I/O devices may enable communication between a person and the computer system 600. As an example, and not by way of limitation, an I/O device may include a keyboard, keypad, microphone, monitor, mouse, printer, scanner, speaker, still camera, stylus, tablet, touchscreen, trackball, video camera, another suitable I/O device or a combination of two or more of these. An I/O device may include one or more sensors. Particular embodiments may include any suitable type and/or number of I/O devices and any suitable type and/or number of interfaces 606 for them. Where appropriate, interface 606 may include one or more drivers enabling processor 608 to drive one or more of these I/O devices. Interface 606 may include one or more interfaces 606, where appropriate.

Bus 604 may include any combination of hardware, software embedded in a computer readable medium, and/or encoded logic incorporated in hardware or otherwise stored (e.g., firmware) to couple components of the computer system 600 to each other. As an example, and not by way of limitation, bus 604 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCI-X) bus, a serial advanced technology attachment (SATA) bus, a Video Electronics Standards Association local (VLB) bus, or any other suitable bus or a combination of two or more of these. Bus 604 may include any number, type, and/or configuration of buses 604, where appropriate. In particular embodiments, one or more buses 604 (which may each include an address bus and a data bus) may couple processor 608 to memory 620. Bus 604 may include one or more memory buses.

Herein, reference to a computer-readable storage medium encompasses one or more tangible computer-readable storage media possessing structures. As an example, and not by way of limitation, a computer-readable storage medium may include a semiconductor-based or other integrated circuit (IC) (such, as for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, a flash memory card, a flash memory drive, or any other suitable tangible computer-readable storage medium or a combination of two or more of these, where appropriate.

Particular embodiments may include one or more computer-readable storage media implementing any suitable storage. In particular embodiments, a computer-readable storage medium implements one or more portions of processor 608 (such as, for example, one or more internal registers or caches), one or more portions of memory 620, one or more portions of storage 610, or a combination of these, where appropriate. In particular embodiments, a computer-readable storage medium implements RAM or ROM. In particular embodiments, a computer-readable storage medium implements volatile or persistent memory. In particular embodiments, one or more computer-readable storage media embody encoded software.

Herein, reference to encoded software may encompass one or more applications, bytecode, one or more computer programs, one or more executables, one or more instructions, logic, machine code, one or more scripts, or source code, and vice versa, where appropriate, that have been stored or encoded in a computer-readable storage medium. In particular embodiments, encoded software includes one or more application programming interfaces (APIs) stored or encoded in a computer-readable storage medium. Particular embodiments may use any suitable encoded software written or otherwise expressed in any suitable programming language or combination of programming languages stored or encoded in any suitable type or number of computer-readable storage media. In particular embodiments, encoded software may be expressed as source code or object code. In particular embodiments, encoded software is expressed in a higher-level programming language, such as, for example, C, Perl, or a suitable extension thereof.

In particular embodiments, encoded software is expressed in a lower-level programming language, such as assembly language (or machine code). In particular embodiments, encoded software is expressed in JAVA. In particular embodiments, encoded software is expressed in Hyper Text Markup Language (HTML), Extensible Markup Language (XML), or other suitable markup language. The foregoing description of embodiments of the disclosure has been presented for purposes of illustration and description. It is not intended to be exhaustive or to limit the disclosure to the precise form disclosed, and modifications and variations are possible in light of the above teachings or may be acquired from practice of the disclosure. The embodiments were chosen and described in order to explain the principals of the disclosure and its practical application to enable one skilled in the art to utilize the disclosure in various embodiments and with various modifications as are suited to the particular use contemplated. Other substitutions, modifications, changes and omissions may be made in the design, operating conditions and arrangement of the embodiments without departing from the scope of the present disclosure. Such modifications and combinations of the illustrative embodiments as well as other embodiments will be apparent to persons skilled in the art upon reference to the description. It is, therefore, intended that the appended claims encompass any such modifications or embodiments.

Depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. Although certain computer-implemented tasks are described as being performed by a particular entity, other embodiments are possible in which these tasks are performed by a different entity.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, the processes described herein can be embodied within a form that does not provide all of the features and benefits set forth herein, as some features can be used or practiced separately from others. The scope of protection is defined by the appended claims rather than by the foregoing description. All changes which come within the meaning and range of equivalency of the claims are to be embraced within their scope.

What is claimed is:

1. A method of optimizing utilization of vehicle onboard storage, the method comprising, by a computer system for a vehicle:
   monitoring real-time environmental conditions via a plurality of sensors positioned in proximity to the vehicle;
   responsive to the monitoring, receiving, from one or more of the plurality of sensors, a first real-time measured value of a first environmental variable and at least one additional real-time measured value of at least one additional environmental variable;
   automatically determining, via a machine-learning model, a first expected value of the first environmental variable given the at least one additional real-time measured value of the at least one additional environmental variable;
automatically generating a storage decision in relation to the first real-time measured value based, at least in part, on an evaluation of the first real-time measured value relative to the first expected value; and
causing execution of the storage decision at least with respect to onboard storage of the vehicle.

2. The method of claim 1, wherein the storage decision indicates at least one of the following:
storage of the first real-time measured value in the onboard storage of the vehicle;
non-storage of the first real-time measured value in the onboard storage of the vehicle; and
transmission of the first real-time measured value over a network for off-board storage.

3. The method of claim 1, wherein the automatically generating comprises:
computing a difference between the first real-time measured value and the first expected value;
expressing the computed difference as a proportion of the first real-time measured value; and
comparing the proportion to each of at least one threshold for the first environmental variable.

4. The method of claim 3, wherein the automatically generating comprises, responsive to the proportion satisfying the at least one threshold, automatically determining, as at least a portion of the storage decision, to store the first real-time measured value in the onboard storage.

5. The method of claim 4, wherein the causing execution comprises storing the first real-time measured value and the at least one additional real-time measured value in the onboard storage.

6. The method of claim 3, wherein:
the at least one threshold comprises a plurality of thresholds, each threshold of the plurality of thresholds being associated with a distinct priority value of a plurality of priority values;
the automatically generating comprises assigning a particular priority value of the plurality of priority values to the first real-time measured value, wherein the assigning is based, at least in part, on the comparing; and
the causing execution comprises storing the first real-time measured value in the onboard storage in relation to the particular priority value.

7. The method of claim 6, wherein:
the onboard storage comprises a fixed-size buffer; and
the causing execution comprises overwriting data in the fixed-size buffer in an order that is at least partially based on the plurality of priority values.

8. The method of claim 3, comprising sending an alert in response to the proportion satisfying the at least one threshold.

9. The method of claim 1, comprising:
responsive to the monitoring, periodically receiving a plurality of real-time measured values of a plurality of environmental variables from the plurality of sensors;
for each environmental variable of the plurality of environmental variables, for each real-time measured value of the environmental variable that is periodically received:
automatically determining, via the machine-learning model, an expected value of the environmental variable given at least one other real-time measured value of at least one other environmental variable of the plurality of environmental variables;
automatically generating a particular storage decision in relation to the real-time measured value based, at least in part, on an evaluation of the real-time measured value relative to the expected value; and
causing execution of the particular storage decision at least with respect to the onboard storage.

10. The method of claim 9, comprising retraining the machine-learning model using stored values of the plurality of environmental variables in the onboard storage.

11. The method of claim 1, wherein the vehicle is an aircraft.

12. A vehicle computer system comprising a processor and memory, wherein the processor and the memory in combination are operable to perform a method comprising:
monitoring real-time environmental conditions via a plurality of sensors positioned in proximity to a vehicle;
responsive to the monitoring, receiving, from one or more of the plurality of sensors, a first real-time measured value of a first environmental variable and at least one additional real-time measured value of at least one additional environmental variable;
automatically determining, via a machine-learning model, a first expected value of the first environmental variable given the at least one additional real-time measured value of the at least one additional environmental variable;
automatically generating a storage decision in relation to the first real-time measured value based, at least in part, on an evaluation of the first real-time measured value relative to the first expected value; and
causing execution of the storage decision at least with respect to onboard storage of the vehicle.

13. The vehicle computer system of claim 12, wherein the storage decision indicates at least one of the following:
storage of the first real-time measured value in the onboard storage of the vehicle;
non-storage of the first real-time measured value in the onboard storage of the vehicle; and
transmission of the first real-time measured value over a network for off-board storage.

14. The vehicle computer system of claim 12, wherein the automatically generating comprises:
computing a difference between the first real-time measured value and the first expected value;
expressing the computed difference as a proportion of the first real-time measured value; and
comparing the proportion to each of at least one threshold for the first environmental variable.

15. The vehicle computer system of claim 14, wherein the automatically generating comprises, responsive to the proportion satisfying the at least one threshold, automatically determining, as at least a portion of the storage decision, to store the first real-time measured value in the onboard storage.

16. The vehicle computer system of claim 14, wherein:
the at least one threshold comprises a plurality of thresholds, each threshold of the plurality of thresholds being associated with a distinct priority value of a plurality of priority values;
the automatically generating comprises assigning a particular priority value of the plurality of priority values to the first real-time measured value, wherein the assigning is based, at least in part, on the comparing; and the causing execution comprises storing the first real-time measured value in the onboard storage in relation to the particular priority value.

17. The vehicle computer system of claim 16, wherein:
the onboard storage comprises a fixed-size buffer; and
the causing execution comprises overwriting data in the fixed-size buffer in an order that is at least partially based on the plurality of priority values.

18. The vehicle computer system of claim 12, the method comprising:
responsive to the monitoring, periodically receiving a plurality of real-time measured values of a plurality of environmental variables from the plurality of sensors;
for each environmental variable of the plurality of environmental variables, for each real-time measured value of the environmental variable that is periodically received:
automatically determining, via the machine-learning model, an expected value of the environmental variable given at least one other real-time measured value of at least one other environmental variable of the plurality of environmental variables;
automatically generating a particular storage decision in relation to the real-time measured value based, at least in part, on an evaluation of the real-time measured value relative to the expected value; and
causing execution of the particular storage decision at least with respect to the onboard storage.

19. The vehicle computer system of claim 18, the method comprising retraining the machine-learning model using stored values of the plurality of environmental variables in the onboard storage.

20. A computer-program product comprising a non-transitory computer-usable medium having computer-readable program code embodied therein, the computer-readable program code adapted to be executed to implement a method comprising:
monitoring real-time environmental conditions via a plurality of sensors positioned in proximity to a vehicle;
responsive to the monitoring, receiving, from one or more of the plurality of sensors, a first real-time measured value of a first environmental variable and at least one additional real-time measured value of at least one additional environmental variable;
automatically determining, via a machine-learning model, a first expected value of the first environmental variable given the at least one additional real-time measured value of the at least one additional environmental variable;
automatically generating a storage decision in relation to the first real-time measured value based, at least in part, on an evaluation of the first real-time measured value relative to the first expected value; and
causing execution of the storage decision at least with respect to onboard storage of the vehicle.

* * * * *